United States Patent [19]

Yamamoto et al.

[11] Patent Number: 4,729,060

[45] Date of Patent: Mar. 1, 1988

[54] COOLING SYSTEM FOR ELECTRONIC CIRCUIT DEVICE

[75] Inventors: Haruhiko Yamamoto, Yokohama; Masaaki Sakai, Tokyo; Yoshiaki Udagawa, Tokyo; Kouji Katsuyama, Yokohama; Mitsuhiko Nakata, Kawasaki, all of Japan

[73] Assignee: Fujitsu Limited, Kanagawa, Japan

[21] Appl. No.: 695,142

[22] Filed: Jan. 25, 1985

[30] Foreign Application Priority Data

Jan. 26, 1984 [JP] Japan .................. 59-013004

[51] Int. Cl.⁴ .................................. H05K 7/20
[52] U.S. Cl. .................... 361/385; 165/80.4; 357/82; 361/382
[58] Field of Search ............. 165/80.4; 174/15 R, 174/16 HS; 357/82; 361/382, 385-388

[56] References Cited

U.S. PATENT DOCUMENTS

| | | | |
|---|---|---|---|
| 3,649,738 | 3/1972 | Andersson et al. | 174/15 R |
| 4,138,692 | 2/1979 | Meeker et al. | 357/82 |
| 4,155,402 | 5/1979 | Just | 165/46 |
| 4,156,458 | 5/1979 | Chu et al. | 165/81 |
| 4,254,431 | 3/1981 | Babuka et al. | 174/16 HS |
| 4,381,032 | 4/1983 | Cutchaw | 165/46 |
| 4,561,011 | 12/1985 | Kohara et al. | 361/386 |

FOREIGN PATENT DOCUMENTS

| | | | |
|---|---|---|---|
| 0001123 | 9/1979 | European Pat. Off. | |
| 1475310 | 2/1967 | France | 174/15 R |
| 0133654 | 8/1982 | Japan | 357/82 |

OTHER PUBLICATIONS

Miller, "Structure for Achieving Thermal Enhancement in a Semiconductor Package", IBM Tech. Disc. Bul., vol. 23, No. 6, 11/80, p. 2308.

Gupta et al., "Protection Device for Fluid-cooled Electrical Apparatus", IBM Tech. Disc. Bul., vol. 24, No. 2, 7/81, pp. 955-956.

Andros et al., "Heat Transfer Apparatus", IBM Tech. Disc. Bul., vol. 22, No. 8A, 1/80, p. 3166.

Brunsch et al. "Semiconductor Chip Cooling System with Temperature Regulation", IBM Tech. Dis. Bul., vol. 24, No. 9, 2/82, pp. 4796-4797.

Shapiro, "IBM Technical Disclosure Bulletin", vol. 25, No. 1, Jun., 1982, p. 44.

Doo et al., "IBM Technical Disclosure Bulletin", vol. 20, No. 4, Sep., 1977, pp. 1436-1437.

Clark et al., "IBM Technical Disclosure Bulletin", vol. 20, No. 5, Oct., 1977, pp. 1769-1771.

Primary Examiner—A. D. Pellinen
Assistant Examiner—Gregory D. Thompson
Attorney, Agent, or Firm—Armstrong, Nikaido, Marmelstein & Kubovcik

[57] ABSTRACT

A cooling module for an electronic circuit component on a printed circuit board includes a passage in which a coolant flows, a first heat transfer plate exposed to the flow of the coolant, a second heat transfer plate secured to the circuit component, a compliant member between the first and second heat transfer plates for establishing a compliant contact therebetween, and a bellows connected to the first heat transfer plate to elastically press the first heat transfer plate against the circuit component through the compliant member and the second heat transfer plate.

32 Claims, 17 Drawing Figures

COOLING SYSTEM FOR ELECTRONIC CIRCUIT DEVICE

BACKGROUND OF THE INVENTION

1. Field of the Invention

The present invention relates to a cooling system for an electronic circuit device. More particularly, it relates to a printed circuit board holding electronic circuit components, wherein these components are cooled by a cooling system that includes a cooling module or a series of cooling modules for removing the heat dissipated from the components and transferring it to a coolant flowing in a passage.

2. Description of the Related Art

In conventional cooling modules for an electronic circuit device a heat transfer element, such as a heat transfer plate or a heat transfer piston, is placed in direct contact with the circuit components, such as integrated circuits (IC), large scale integrated circuits (LSI), and semiconductors, by pressure from a spring or a bellows, to remove the heat dissipated from these circuit components. The heat transfer elements are directly or indirectly exposed to a coolant (usually a gaseous coolant), in such a manner that the heat removed from the circuit components is transferred to the coolant by means of the corresponding heat transfer element. However, these prior arts have the following drawbacks: (a) the surface area for an effective heat transfer between the heat transfer elements and the corresponding circuit components is relatively small; (b) complete surface contact therebetween cannot be achieved, resulting in a large and non-uniform thermal contact resistance; and (c) any change in the pressure from the spring or bellows leads directly to a change in the thermal contact resistance, resulting in an unstable thermal contact resistance. All of the above are the causes of a large loss in the heat transfer efficiency. Additional methods of cooling electronic circuit devices can be found in a related case filed on Jan. 22, 1985 and having Ser. No. 693,432.

SUMMARY OF THE INVENTION

The primary object of the present invention is to eliminate the aforementioned drawbacks of the prior art by providing a cooling system for an electronic circuit device which can effectively, stably, and uniformly cool the circuit components.

To achieve the object mentioned above, according to the present invention, there is provided a compliance means between a first heat transfer means which is exposed to a coolant and the circuit component to be cooled. The compliance means establishes a compliant surface contact between the first heat transfer means and the circuit component, in that the compliance means is pressed against the circuit component by an elastic means, such as spring, diaphragm, bellows, or any combination thereof.

According to another embodiment of the present invention, a second heat transfer means is additionally provided on and secured to the circuit component. In this embodiment, the compliance means is located between the first and second heat transfer means.

According to still another embodiment of the present invention, there is provided a series of cooling modules, each module being provided for the corresponding circuit element or elements. Each cooling module comprises a first transfer means exposed to a common flow of the coolant, a second heat transfer means secured to the corresponding circuit component, and a compliance means between the first and second heat transfer means for establishing a compliant contact therebetween. The first heat transfer means and the compliance means are together pressed against the corresponding circuit components by an elastic means connected to the first heat transfer means, through the second heat transfer means. Alternatively, the second heat transfer means can be dispensed with, and in the alternative, the compliance means pressed directly against the corresponding circuit components.

BRIEF DESCRIPTION OF THE DRAWINGS

Other features, properties and technical advantages of the present invention will become apparent from the description given below with reference to the drawings, in which.

DESCRIPTION OF THE PREFERRED EMBODIMENTS

Figure 1:
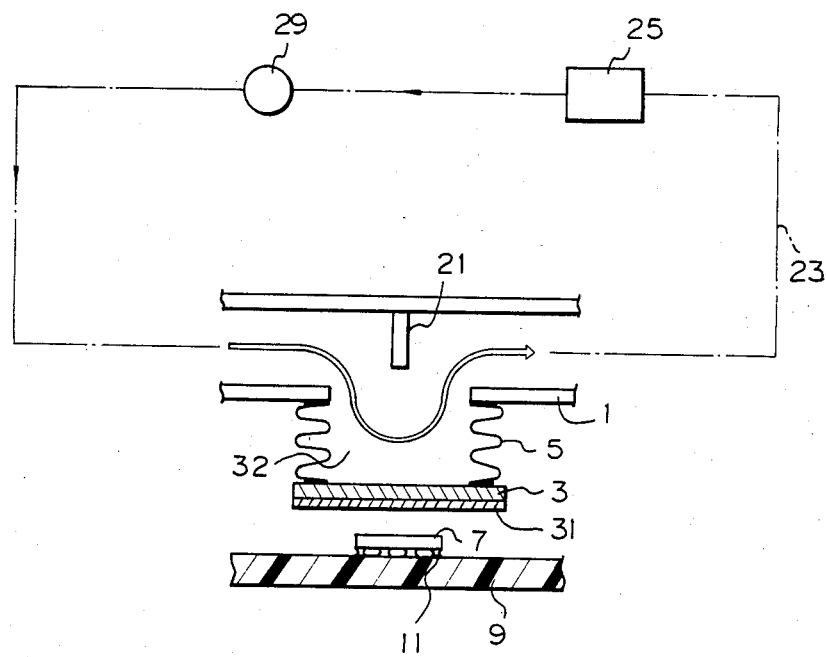
FIG. 1 is a schematic sectional view of a cooling system according to the present invention.

First, the prior art will be discussed with reference to FIG. 16, in which the cooling module has a heat transfer plate 3 connected to a header 1 with a coolant passage in which a coolant flows, by means of a bellows 5. The heat transfer plate 3 is exposed to the flow of the coolant, as shown by arrows. The plate 3 is pressed against an electronic circuit component 7, such as an IC, LSI, or semiconductor provided on a printed circuit board 9, by means of the bellows 5 and the hydraulic pressure of the coolant.

The component 7 is bonded to the printed circuit board 9 by, for example, solder balls 11. When the heat transfer plate 3 is pressed into contact with the component 7, the heat dissipated from the component 7 can be removed therefrom by the heat transfer plate 3 and transferred to the coolant.

Figure 17:
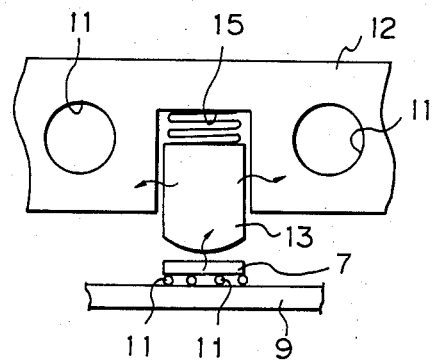

In a different known arrangement as shown in FIG. 17, the heat transfer plate is replaced by a heat transfer piston 13 biased by a spring 15. The piston 13 is pressed onto the circuit component 7 on the printed circuit board 9, by the spring 15. The coolant flows in the passages 11 provided in the coolant header 12.

Figure 15:
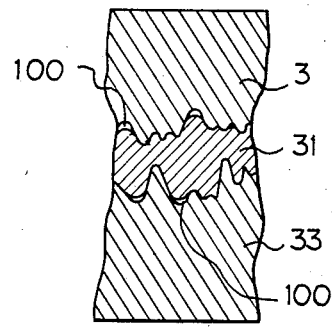
FIG. 15 is an enlarged sectional view of a compliant member arranged between the first and second heat transfer plates, according to the present invention; and, FIGS. 16 and 17 are views of arrangements of cooling systems according to the prior art.
Figure 16:
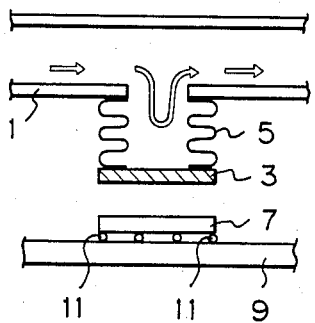

In the arrangement shown in FIG. 16, however, since the heat transfer plate 3 is the same size as the circuit component 7, the heat transfer surface is small. In addition, the plate 3 cannot come into complete surface contact with the component 7, due to unevenness of the surface of the plate 3 (and the component 7), and, accordingly, the thermal contact resistance increases and becomes unstable and non-uniform. The unevenness of the surface of plate 3 is illustrated in FIG. 15, where a compliant contact member is provided between the uneven surface of plate 3 and second heat transfer plate 33.

Furthermore, when the pressure exerted on the component 7 by the bellows 5 and by the coolant fluctuates, the fluctuation is a direct cause of a change in the thermal contact resistance.

On the other hand, in the arrangement shown in FIG. 17, there is a large loss in heat transfer efficiency (heat conductivity) in the coolant header 12. In addition to the foregoing, since the arrangement of FIG. 17 has a relatively large number of thermal connecting portions between the piston 13 and the header 12, in comparison with the arrangement of FIG. 16, a relatively large heat transfer loss must be expected. Therefore, the arrangement shown in FIG. 17 must use a gaseous coolant having a high heat conductivity, such as $H_2$ or $He$, thus resulting in the necessity for providing a seal mechanism for the coolant gas.

These drawbacks of the prior art can be eliminated by the present invention, as shown below.

FIG. 1 shows an embodiment of the present invention in which the coolant module has a coolant header 1 with a coolant passage for the coolant flow.

The coolant can be gas but is not limited thereto, and may be a liquid, such as water, liquid fluorocarbon, or even a liquid metal such as mercury or gallium. The coolant header 1 is preferably a part of a recirculation line 23 having therein a pump 29 and a heat radiator or heat exchanger 25.

A first heat transfer plate 3 is connected to the header 1 by means of a bellows 5 attached to the header 1. The header 1 has a deflector 21 extending toward the first heat transfer plate 3. A coolant recirculation zone 32 is defined in the bellows 5, in which zone 32 the first heat transfer plate 3 is exposed to the coolant at one side face of the plate 3.

The direction of the coolant flow in the header 1 is changed by the deflector 21, which can be dispensed with, and thus the heat is removed from the first heat transfer plate 3 in the circulation zone 32.

According to the present invention, a heat transferring compliant member 31 is provided between the first heat transfer plate 3 and the circuit component 7. In the illustrated embodiment, the sheet-like or plate-like compliant member 31 is secured to the outer side face of the first heat transfer plate 3. Alternatively, the compliant member 31 can be secured to the circuit component 7 on the printed circuit board 9.

The compliant member 31 can be secured to the first heat transfer plate 3 or the circuit component 7 by means of a proper adhesive.

The compliant member 31 will come into a full compliant contact with the circuit component 7, even when the plate 3 and/or the circuit component has an uneven or irregular surface. The compliant member 31 can be made of elastic, thermodeformable, compressible, or thermocompressible materials which will deform or are compressed when heated or subjected to pressure. The compliant member 31 is preferably made of elastic materials having a high heat conductivity. As the thermodeformable materials used for the compliant member 31, a polyolefin elastomer which will soften at a temperature of approximately 80° C., or a combined material containing, for example, a polyolefin elastomer as a binder and a metal oxide filler, such as alumina ($A_2O_3$), boron nitride (BN), or beryllia (BeO) can be used. As the pressure deformable material used for the compliant member 31, materials containing a binder such as silicone elastomer or polyolefin elastomer, and a ceramic filler, such as alumina, boron nitride, or beryllia can be used.

The compliant member 31 also can be made of high heat conductive plastic materials or soft metals, such as indium alloy or gallium alloy.

It is also possible to coat one or both side face(s) of the compliant member 31 with a semiflowable material, such as grease. In addition, the compliant member 31 is preferably made of electrical insulation materials or has an electrical insulation layer 30 on one or both side face(s) to insulate the cooling module from, for example, a substrate of a circuit component, for example, an ECL circuit.

The first heat transfer plate 3 is made of materials having a high heat conductivity, such as copper or copper alloy.

Figure 2:
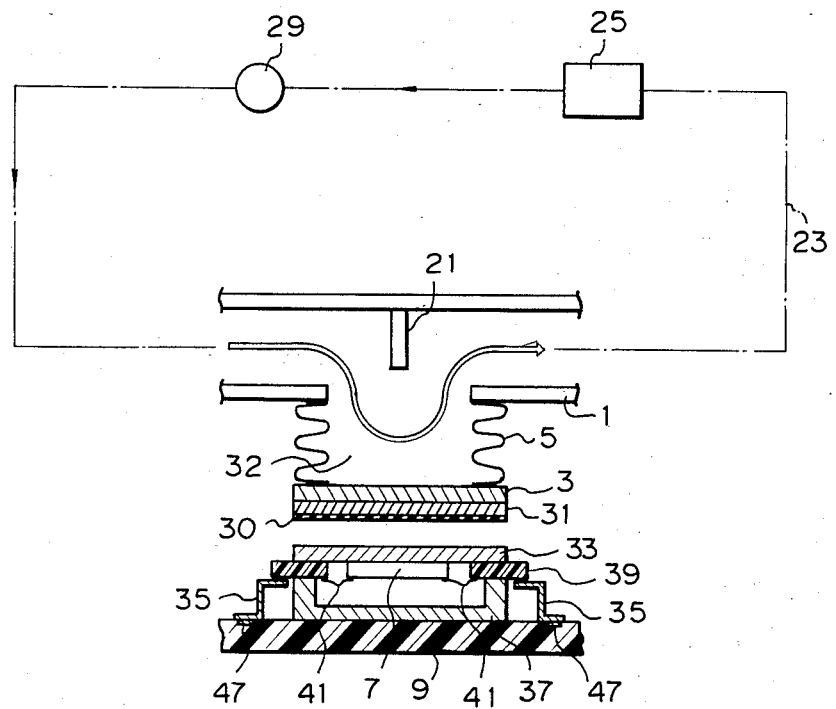
FIG. 2 is a view similar to FIG. 1, but according to another embodiment of the present invention.

Preferably, a second heat transfer plate 33 is provided between the compliant member 31 and the circuit component 7. The second plate 33 can be secured to the circuit component 7, by soldering or die bonding, as shown in FIG. 2. The second plate 33 has a larger surface area than the corresponding circuit component 7, and thus the second plate 33 has a large heat transfer surface. The second plate 33 is preferably made of a material having the same thermal expansion coefficient as that of the corresponding circuit component 7.

For example, when the circuit component 7 is made of silicon, or GaAs, the second plate 33 can be made of an Mo or Mo/Cu clad or the like.

The bellows 5 can be made by a known hydraulic forming method, welding method, or electric deposit forming method.

It is also possible to make the bellows from polyfluoroethylene fiber. The electric deposit method referred to is a process in which an aluminium die is first coated with nickel and the aluminium die is then dissolved, so that only the nickel coating layer remains, which layer forms a bellows.

Figure 12:
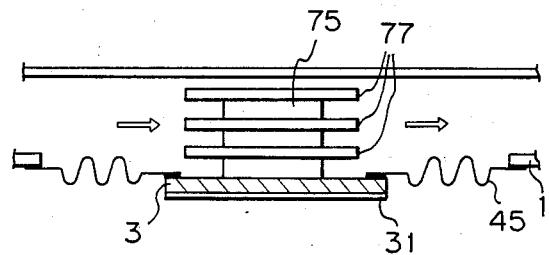

The bellows 5 can be replaced by a diaphragm 45, as shown in FIG. 12, which will be described later.

The circuit component 7 can be bonded directly to the printed circuit board 9 by electrically conductive solder balls 11, as shown in FIG. 1. In the arrangement shown in FIG. 2, the circuit component 7 is secured to the second heat transfer plate 33 supported on a wiring board 39, which is in turn supported on a support 37 usually made of an insulation material.

The circuit component 7 is a electrically connected to the wiring board 39 by means of wires or leads 41. The wiring board 39 is electrically connected to conductor patterns 47 provided on the printed circuit board 9 by means of lead frames 35.

Figure 3:
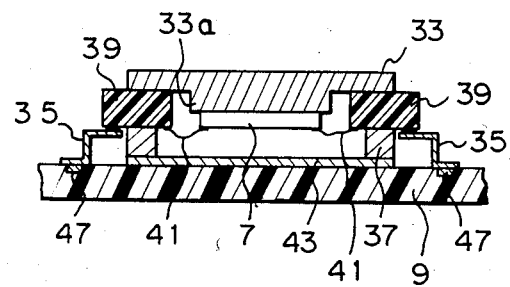
FIG. 3 is a partial sectional view of a different arrangement of an electronic circuit device to which the present invention is to be applied.

FIGS. 3 to 7 show different arrangements of the circuit device; in which FIG. 3 shows a hermetic seal package construction of the circuit device. In FIG. 3, the circuit component 7 is housed in a hermetic sealing package having a hermetic sealing lid 43 connected to the support 37 and secured to the printed circuit board 9. The second heat transfer plate 33 has a stepped portion 33a to which the circuit component 7 is secured.

Figure 4:
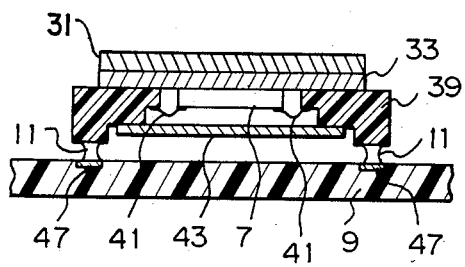
FIGS. 4-7 are other arrangements of an electronic circuit device, different from FIG. 3.

In FIG. 4, the lead frames 35 are dispensed with. Instead, the wiring board 39 is electrically connected to the conductor patterns 47 of the printed circuit board 9 by means of the conductive solder balls 11. The circuit component 7 is housed in the hermetic sealing package having the hermetic sealing lid 43 secured to the wiring board 39 which supports the second heat transfer plate 33. FIG. 4 also shows compliant member 31 attached directly to second heat transfer plate 33.

Figure 5:
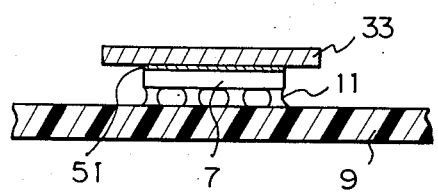

In FIG. 5, the circuit component 7 is directly bonded to the printed circuit board 9 by means of the conductive solder balls 11. Namely, the individual chip of the circuit component 7 per se is located on the printed circuit board without holding or supporting means other than the above said solder balls 11.

The component 7 is bonded to the second heat transfer plate 33 by means of a soldering layer or Au-Si eutectic alloy layer 51 in a conventional die bonding method. The die bonding of the component 7 to the second plate 33 can be effected either before or after the component 7 is soldered to the printed circuit board 9. The melting point of the layer 51 may be higher or lower than that of the solder balls 11.

Figure 6:
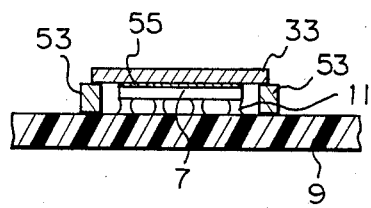

In FIG. 6, the second heat transfer plate 33 is supported on and by standoff supports 53 provided on the printed circuit board 9. The circuit component 7 is directly and electrically connected to the printed circuit board 9.

The component 7 is adhered to the second plate 33 by means of a heat conductive bonding, such as low temperature solder 55.

The standoff supports 53 receive the pressure from the first heat transfer plate 3 (FIG. 1 or 2), and are secured to the second plate 33 by means of the proper adhesive or solder.

Figure 7:
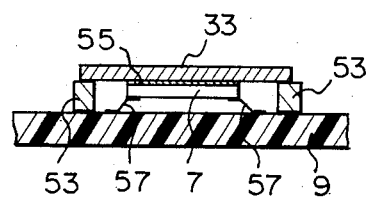

In FIG. 7, the circuit component, e.g., a Tape Aided Bonding (TAB) chip 7 is bonded to the second plate 33 by means of bonding layer 55, such as a low temperature solder layer. The chip 7 is electrically connected to the printed circuit board 9 by means of TAB leads 57, in place of the solder balls.

Figure 8:
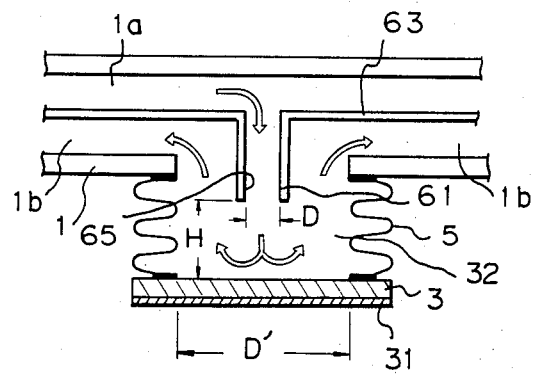
FIGS. 8-12 are schematic sectional views of five different embodiments of cooling modules, from a cooling module shown in FIG. 2.

FIG. 8 shows another embodiment of a cooling module according to the present invention.

In FIG. 8, the header 1 has therein a partition wall 63 extending along the length of the header 1. The partition wall 63 divides the inside area of the header 1 into two sections; section 1a for the flow of coolant coming from the pump 29, and the other 1b for the flow of coolant returning to the pump.

The partition wall 63 had a nozzle 61 having a nozzle opening 65 of an inner diameter D. The nozzle opening opens into the circulation zone 32 formed in the bellows 5. Preferably, the nozzle 61 extends toward the center of the circulation zone 32, and accordingly, the center of the first plate 3, so that the flow of the coolant ejected from the nozzle 61 impinges on the first plate 3, and is then returned into the return passage section 1b; thus effectively removing the heat from the first heat transfer plate 3. Namely, the nozzle can realize the so-called jet cooling.

The flow velocity of the jet is, for example, 0.5 m/s to 3 m/s. To increase the efficiency of the heat transfer between the first plate 3 and the coolant jet, it has been experimentally confirmed that the distance H between the front end of the nozzle opening 65 and the surface of the first plate 3 is two to four times the inner diameter D of the nozzle opening 65 $2D \leq H \leq 4D$. In addition, the optimum ratio between the inner diameter D and a diameter D' of an effective heat transfer surface of the first plate 3 is $3D \leq D' \leq 6D$. For example, when water is used as the coolant, if the ratios between H and D and between D and D' satisfy the above conditions, the coefficient of heat transfer between the first plate 3 and the coolant jet is 15,000~30,000 Kcal/$m^2h°C$.

Figure 9:
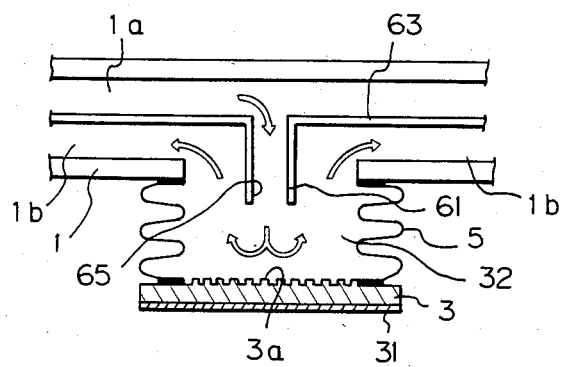

FIG. 9 shows a variant of FIG. 8, in which the first plate 3 has a ridged surface 3a which increases the surface area available for the heat transfer.

Figure 10:
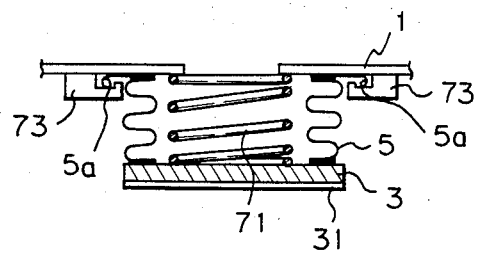

FIG. 10 shows another embodiment of a cooling module, in which the pressure from the bellows 5 on the first plate 3 is augmented by an additional spring 71 located between the header 1 and the first plate 3. The provision of the spring 71 decreases the initial spring load of the bellows 5 and also decreases the possibility of plastic deformation of the bellows 5. In the embodiment shown in FIG. 10, the bellows 5 has O-ring-like upper terminal ends 5a secured to the header 1 by means of sealing brackets 73.

The spring 71 can be also used to augment the pressure of the diaphragm 45 (FIG. 11) provided in place of the bellows 5 as the pressing means for the first plate 3.

Alternatively, it is also possible to utilize the hydraulic pressure of the coolant in place of the spring 71. The hydraulic pressure of the coolant can be created and controlled by the pump 29.

Preferably, the first plate 3 and the compliant member 31 are pressed against the circuit component or the second plate 33, if used, by the spring force of the bellows 5 even when the hydraulic pressure is released or when there is no coolant in the circulation zone 32, so that no foreign material can enter the contact surface between the compliant member 31 and the circuit component 7 (FIG. 1) or the second plate 33 (FIG. 2) when the pump is not operative or the electronic circuit device is in a non-operational state.

Figure 11:
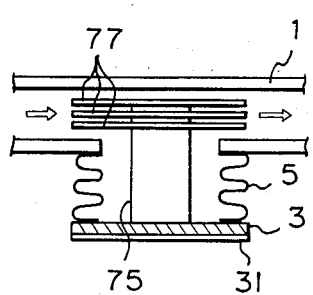

FIG. 11 shows a modification of a cooling module according to the present invention. In FIG. 11, a heat transfer stud 75 is additionally provided on the first plate 3. The stud 75 is rigidly connected to the first plate 3 to transfer heat from the first plate 3 to the coolant. The stud 75 has at its upper end cooling fins 77 which extend in the flow of the coolant in the header 1 in parallel to the direction of flow of the coolant. The stud 75 is preferably solid, so that the heat transferred thereto from the first plate 3 is effectively transferred to the coolant through the fins 77.

FIG. 12 shows a variant of the elastic pressure means for the first plate 3. Namely, in FIG. 12, the bellows 5 in the aforementioned embodiments are replaced with the diaphragm 45.

The diaphragm 45 is rigidly connected to the header 1 and the first heat transfer plate 3. The diaphragm 45 applies pressure to the first plate 3 and the compliant member 31, forcing them onto the second plate 33, or onto the circuit component 7 when the second plate 33 is omitted. The heat transfer solid stud 75 having the fins 77 is provided on the first plate 3. In the embodiment illustrated in FIG. 12, since the diaphragm 45 lies substantially on a horizontal plane, a stud having a shorter vertical length can be used, in comparison with that shown in FIG. 11, and accordingly, a higher heat transfer efficiency is obtained. In the embodiment shown in FIG. 12, the distance between the header 1 and the circuit component 7 or the second plate 33 is smaller than that shown in FIG. 11, since the diaphragm 45 lies on a plane substantially flush with the header 1.

As can be understood from the foregoing, according to the present invention the compliant member 31 is provided between the first heat transfer plate 3 and the second heat transfer plate 33 or the circuit component 7, unevenness of the surface or deflection of the first heat transfer plate 3 and/or the second heat transfer plate 33 can be effectively absorbed by the compliant member 31, thus resulting in a decrease in the number of air cavities 100, which have a large thermal resistance, between the first and second plates 3, 33 or between the first plate 3 and the circuit component 7. Namely, the compliant member 31 establishes a compliant contact between the first and second plates 3, 33, which inevitably have irregular or uneven surfaces and thus would otherwise increase the number of air cavities therebetween, as shown in FIG. 15.

Figure 13:
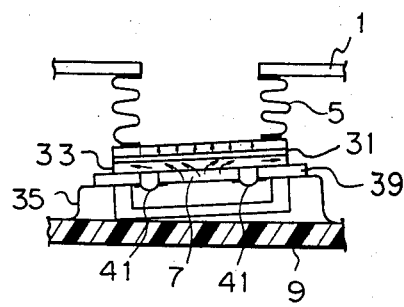
FIG. 13 is a schematic sectional view of an arrangement the same as that shown in FIG. 2, but with the cooling module in an inclined state, for explaining the technical effect of the present invention.

In addition, according to the present invention, even if the second plate 33 and the circuit component 7 are inclined when packaged on the printed circuit board, the inclination can be effectively absorbed by the compliant member 31, as shown in FIG. 13, and because the second heat transfer plate 33 is larger than the corresponding circuit component, the heat transfer efficiency thereof from the circuit component 7 is increased. The above inclination may be caused by the inclination of the bellows 5 or diaphragm 45, and this can also be absorbed by the compliant member 31.

Figure 14:
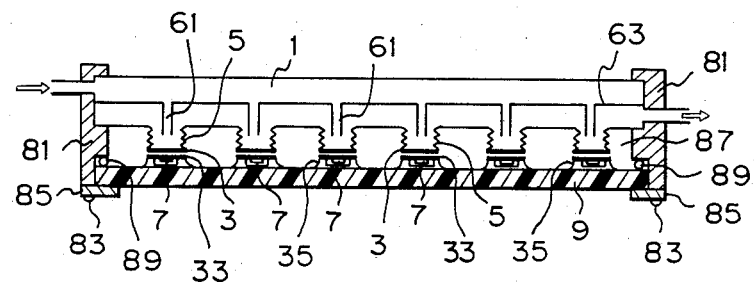
FIG. 14 is a schematic view of an arrangement of a series of cooling modules, according to another embodiment of the present invention.

FIG. 14 shows a series of cooling modules for the corresponding circuit components 7. Although a large number of circuit components are usually arranged on the printed circuit board 9, each of the cooling modules mentioned above can be provided for each circuit component. Preferably, the header 1 for the coolant is common to all cooling modules. The arrangement shown in FIG. 14 includes a series of cooling modules and is substantially identical to the arrangement shown in FIG. 8.

The header 1 is held by the supporting frames 81 rigidly connected to the printed circuit board 9 by keep plates 85, which are in turn secured to the supporting frames 81 by set screws 83. Inside the supporting frames 81 there is defined a space 87 between the header 1 and the printed circuit board 9. The space 87 preferably contains an inert gas such as He or other gas, such as H2, which has a high heat conductivity. The gas contained in the space 87 serves as a heat transfer agent between the circuit component and the coolant in the header 1. Namely, the heat of the circuit component can be also transferred to the coolant in the header 1 or in the bellows 5 through the pipe of the passage or the bellows by means of the gas contained in the space 87, in addition to the aforementioned heat transfer route of the first plate 3 and the compliant member 31. The space 87 is preferably sealed by seal members such as O-rings, C-rings, or spring-biased C-rings 89 provided between the printed circuit board 9 and the frames 81.

It is also possible to provide the same arrangement of the cooling module or a series of cooling modules on the opposite side of the printed circuit board when the circuit components also are provided on the opposite side face thereof.

As can be seen from the above mentioned description, according to the present invention, the compliant member can increase the allowable heat transfer between the circuit component and the first and/or second heat transfer plates and decrease the thermal contact resistance therebetween, resulting in a high heat transfer ratio and a high cooling efficiency.

We claim:

1. A cooling system used with a printed circuit board having at least one solid state electronic circuit component, said cooling system comprising:
   a cooling header having a passage through which a supply of coolant flows;
   a first heat transfer means operatively connected to said cooling header such that at least part of said first heat transfer means is exposed to the flow of the coolant, and such that heat may be transferred from said first heat transfer means to the coolant;
   an elastic, compliance means, disposed between said first heat transfer means and the electronic circuit component, and establishing an elastic, compliant contact between said first heat transfer means and the electronic circuit component; and
   an elastic means, connected to said first heat transfer means and said cooling header, and biasing said first heat transfer means against the circuit component through said compliance means.

2. A cooling system according to claim 1, wherein said cooling system further comprises a second heat transfer means secured to the circuit component in such a manner that the compliance means is located between the first and second heat transfer means, transferring heat from the circuit component to the coolant through the compliance means and the first heat transfer means.

3. A cooling system according to claim 1, wherein said compliance means is provided on the first heat transfer means.

4. A cooling system according to claim 2, wherein said compliance means is provided on the second heat transfer means.

5. A cooling system according to claim 1, wherein said first heat transfer means comprises a first heat transfer plate having a high heat transfer property.

6. A cooling system according to claim 2, wherein said second heat transfer means comprises a second heat transfer plate having a high heat transfer property.

7. A cooling system according to claim 6, wherein said second heat transfer plate has a plate surface larger than the circuit component.

8. A cooling system according to claim 1, wherein said compliance means comprises a sheet-like member made of a thermodeformable and thermally conductive material which deforms when heated.

9. A cooling system according to claim 1, wherein said compliance means comprises a sheet-like member made of a compressible and thermally conductive material.

10. A cooling system according to claim 1, wherein said compliance means comprises a sheet-like member made of a thermocompressible and thermally conductive material which is compressed when heated.

11. A cooling system according to claim 1, further comprising means supporting the circuit component on the printed circuit board.

12. A cooling system according to claim 1, wherein said compliance means comprises a sheet-like member made of an electrically insulative and thermally conductive material.

13. A cooling system according to claim 1, further comprising an electrical insulating and thermally conductive layer on the compliance means.

14. A cooling system according to claim 1, wherein said elastic means comprises a bellows connecting the first heat transfer means to the passage in said cooling header.

15. A cooling system according to claim 14, wherein said cooling system further comprises a nozzle provided in the passage in said cooling header and having a nozzle opening located in the bellows to eject the coolant into the bellows toward the first heat transfer means.

16. A cooling system according to claim 15, wherein said nozzle opening is spaced from the first heat transfer means at a distance within 2 to 4 times the inner diameter of the nozzle opening.

17. A cooling system according to claim 15, wherein said first heat transfer means comprises a first heat transfer plate having a planar heat transfer surface having an effective heat transfer diameter which is within 3 to 6 times the inner diameter of the nozzle.

18. A cooling system according to claim 1, wherein said elastic means comprises a diaphragm which elastically connects the first heat transfer means and the cooling header.

19. A cooling system according to claim 1, wherein said cooling system further comprises a heat transfer stud provided on the first heat transfer means and located in the flow of the coolant.

20. A cooling system according to claim 19, wherein said stud comprises heat cooling fins on the periphery thereof.

21. A cooling system according to claim 6, wherein said second heat transfer plate forms a part of a hermetic seal package having therein said circuit component.

22. A cooling system according to claim 1, wherein said circuit componenet is an individual chip directly bonded to the printed circuit board without holding or supporting means other than solder balls.

23. A cooling system according to claim 14, wherein said elastic means further comprises a spring in the bellows applying pressure to the first heat transfer means together with the bellows.

24. A cooling system according to claim 5, wherein said first heat transfer plate has a heat transfer surface which is exposed to the coolant and which has a ridged surface for increasing the surface area of the heat transfer surface.

25. A cooling system according to claim 14, wherein said cooling system further comprises a hydraulic pressure source for applying pressure to the first heat transfer means together with the bellows.

26. A cooling system according to claim 18, wherein said cooling system further comprises a hydraulic pressure source for applying pressure to the first heat transfer means.

27. A cooling system according to claim 2, wherein said first heat transfer means and said second heat transfer means are continuously brought into contact with each other through the compliance means by the elastic means.

28. A cooling system according to claim 1, wherein said coolant is a liquid.

29. A cooling system according to claim 1, wherein said coolant is a gas.

30. A cooling system for use with a printed circuit board having a plurality of solid state electronic circuit components, said cooling system comprising:
  a cooling header having a passage through which a supply of coolant flows, said cooler header having a plurality of cooling modules receiving said coolant for each of said plurality of solid state electronic circuit components, each cooling module including,
  (a) a first heat transfer means operatively connected to said cooling module such that at least part of said first heat transfer means is exposed to the flow of the coolant, and such that heat may be transferred from said first heat transfer means to the coolant,
  (b) an elastic, compliant means, disposed between said first heat transfer means and a corresponding electronic circuit component, and establishing an elastic, compliant contact between said first heat transfer means and the corresponding electronic circuit component, and
  (c) an elastic means, connected to said first heat transfer means and said cooling header, and biasing said first heat transfer means against the corresponding circuit component through said compliance means.

31. A cooling system according to claim 30, wherein each of said cooling modules comprises a second heat transfer means secured to the corresponding circuit component so that the compliance means is located between the first and second heat transfer means, transferring the heat from the corresponding circuit component to the coolant through the compliance means and the first heat transfer means.

32. A cooling system according to claim 31, further comprising means enclosing a heat transfer gas around each of said cooling modules.

* * * * *